United States Patent
Roeser et al.

(10) Patent No.: US 10,768,816 B2
(45) Date of Patent: Sep. 8, 2020

(54) METHOD AND APPARATUS TO MANIPULATE CUSTOMER DATA WITHOUT USING THE HOST INTERFACE

(71) Applicant: Western Digital Technologies, Inc., San Jose, CA (US)

(72) Inventors: Mackenzie Roeser, San Jose, CA (US); Robert Hill, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 121 days.

(21) Appl. No.: 15/959,875

(22) Filed: Apr. 23, 2018

(65) Prior Publication Data
US 2019/0324650 A1    Oct. 24, 2019

(51) Int. Cl.
G06F 3/06       (2006.01)
G06F 12/0875    (2016.01)
G06F 12/02      (2006.01)

(52) U.S. Cl.
CPC .......... *G06F 3/0605* (2013.01); *G06F 3/0656* (2013.01); *G06F 3/0659* (2013.01); *G06F 3/0679* (2013.01); *G06F 12/0223* (2013.01); *G06F 12/0875* (2013.01); *G06F 2212/2022* (2013.01); *G06F 2212/222* (2013.01); *G06F 2212/40* (2013.01)

(58) Field of Classification Search
None
See application file for complete search history.

(56) References Cited

U.S. PATENT DOCUMENTS

| | | | | |
|---|---|---|---|---|
| 2007/0260757 | A1* | 11/2007 | Bueb | G06F 13/385 710/5 |
| 2016/0011777 | A1* | 1/2016 | Furuhjelm | G06F 3/061 718/1 |
| 2017/0371794 | A1* | 12/2017 | Kan | G06F 3/0652 |
| 2018/0129440 | A1* | 5/2018 | Bandic | G06F 3/0604 |

* cited by examiner

*Primary Examiner* — Denise Tran
(74) *Attorney, Agent, or Firm* — Patterson & Sheridan, LLP; Steven Versteeg

(57) ABSTRACT

A method is disclosed for changing data within a solid state drive without using a host interface, comprising issuing a write buffer command with a code to the solid state drive, receiving the code at the solid state drive, storing the code at the solid state drive, transmitting a command to run the code at the solid state drive, running the code with a processor in a virtual machine arranged within the solid state drive, wherein the running of the code alters data within the solid state drive and altering at least one memory arrangement in the solid state drive such that the memory arrangement records the altered data.

25 Claims, 2 Drawing Sheets

METHOD AND APPARATUS TO MANIPULATE CUSTOMER DATA WITHOUT USING THE HOST INTERFACE

BACKGROUND OF THE DISCLOSURE

Field of the Disclosure

Aspects of the disclosure relate to computer systems. More specifically, aspects of the disclosure relate to memory arrangements, like solid state drives, and methods and apparatus to manipulate customer data without using a host interface.

Description of the Related Art

Conventional methods and apparatus for storing data require the use of a host and a memory arrangement, such as a disk drive. In typical arrangements, the host is a computer that provides an interface to allow for communication between the disk drive and the computer. This interface is generally described as a host interface.

Host interfaces and control of host interfaces may come in several configurations and work by several methods. As a non-limiting example, there is a host controller interface for Firewire connections, USB connections, Bluetooth connections and non-volatile memory connections. Host controller interfaces for non-volatile memory connections may come in several types. For non-volatile memory connections, the interface may enable Serial AT attachment ("SATA") express/Non-Volatile Memory ("NVM") Express solid state drives.

A host adapter is provided to act as a connection point between the host and a connected device. The host adapter may also be conventionally known as a host controller or a host bus adapter (HBA). The host adapter may use SATA devices, as described above, or may also use a small computer system interface ("SCSI") or Fibre Channel. In some embodiments, Fibre Channel, using a Fibre Channel protocol is used for the connection of solid state drives or solid state mediums to hosts.

Use of differing host adapters has grown more prevalent as time has progressed in the computer industry. The complexity of the adapters, the need for obtaining a unifying specification allowing different types of devices to be connected to a host has become increasingly problematic for computer designers and architects.

Data on memory arrangements, such as a solid state drive, is often requested by a host such that different functions can be performed by the host. Such requests may be directly related to critical functions being undertaken by the host, or the requests may be more maintenance related and not as vital. These requests can pass through the host adapter at different times. In times of high data traffic through the host adapter, maintenance requests may slow down more vital processes being undertaken by the computer. This, in turn, slows down the entire processing capability of the host and increases latency which users experience.

As computer manufacturers try to increase the overall speed of their respective host machines, even small delays (latencies), can negatively impact sales of such computers. Computer manufacturers, therefore, try to increase their speeds wherever possible and request individual component manufacturers to produce the fastest possible components systems possible.

There is a need to provide a method and apparatus to allow a computer user to manipulate data, such as on a solid state drive, without using a host interface.

There is a need to provide a method and apparatus to allow a computer user to manipulate data, such as on a solid state drive, without causing delays in processing of requests on a host interface.

There is a further need to provide a method and apparatus that is economical to produce and operate to allow for manipulation of data without a host interface.

There is a further need to provide a method and apparatus that may be updated, at intervals, to provide for more efficient processing of data as needs for processing change over time.

SUMMARY OF THE DISCLOSURE

The following summary is provided for describing aspects of the disclosure and should not be considered limiting of the scope of the aspects described.

In one non-limiting embodiment, a method for changing data within a solid state drive without using a host interface is disclosed comprising issuing a write buffer command with a code to the solid state drive, receiving the code at the solid state drive, storing the code at the solid state drive, transmitting a command to run the code at the solid state drive, running the code with a processor in a virtual machine arranged within the solid state drive, wherein the running of the code alters data within the solid state drive and altering at least one memory arrangement in the solid state drive such that the memory arrangement records the altered data.

In one non-limiting embodiment, an apparatus for manipulating data in a memory arrangement, comprising: means for issuing a write buffer command with a code to memory arrangement and transmitting a command to run a code at the memory arrangement; means for receiving the code at a means within the memory arrangement configured to receive code, means for storing the code at the solid state drive; means for executing the code with a processor in a virtual machine arranged within the memory arrangement wherein the running of the code alters data within the memory arrangement; and means for altering at least one memory unit in the memory arrangement such that the memory arrangement records the altered data.

In another non-limiting embodiment, an apparatus to store and perform alteration of data is disclosed comprising a device with an input and an output for data, the device configured to be connected to a computer, the device comprising, a memory arrangement within the device, configured to send and receive data from a host at least one physical processor connected to the memory arrangement, the at least one physical processor configured to receive and process data from the memory arrangement, at least one transmission pathway connecting the memory arrangement and the at least one physical processor, the at least one transmission pathway configured to transmit data and a virtual machine connected to the at least one transmission pathway, the virtual machine configured to at least one of alter data stored on the memory arrangement without a use of a host adapter.

In another non-limiting embodiment, a method for changing data within a memory arrangement without using a host interface is disclosed. The method comprises issuing a write buffer command with a code to the memory arrangement, receiving the code at the memory arrangement, executing the code with a processor in a virtual machine arranged within the memory arrangement, wherein the running of the code alters data within the memory arrangement and altering at least one portion of the memory arrangement.

In another non-limiting embodiment, an apparatus for changing data within a memory arrangement without using a host interface is disclosed. The method comprises means for issuing a write buffer command with a code to the memory arrangement, means for receiving the code at the memory arrangement, means for storing the code at the memory arrangement, executing the code with a processor in a virtual machine arranged within the memory arrangement to alter data within the memory arrangement and storing at least one portion of the memory arrangement.

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
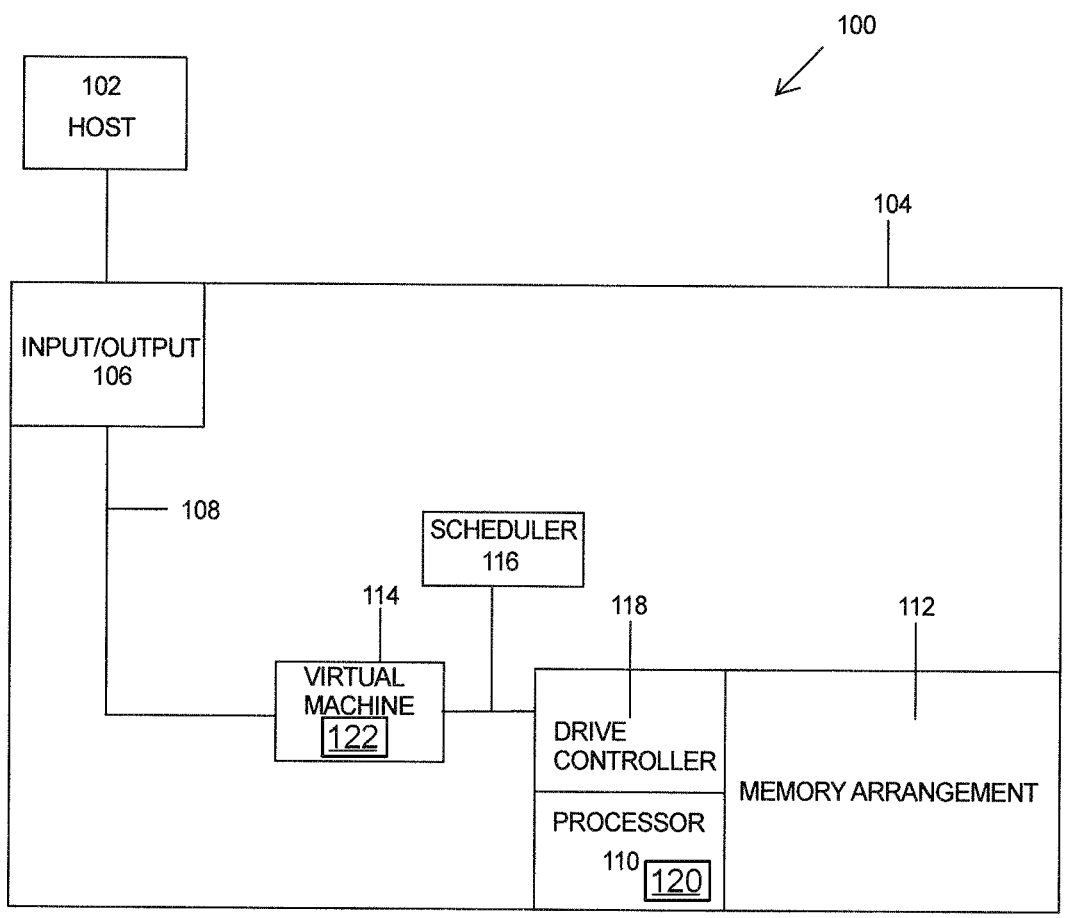
FIG. 1 is a cross-sectional diagram of a computer arrangement in conformance with one example embodiment of a described aspect.

Some embodiments will now be described with reference to the figures. Like elements in the various figures will be referenced with like numbers for consistency. In the following description, numerous details are set forth to provide an understanding of various embodiments and/or features. It will be understood, however, by those skilled in the art that some embodiments may be practiced without many of these details and that numerous variations or modifications from the described embodiments are possible. As used herein, the terms "above" and "below", "up" and "down", "upper" and "lower", "upwardly" and "downwardly", and other like terms indicating relative positions above or below a given point or element are used in this description to more clearly describe certain embodiments.

Aspects of the present disclosure relate to computer operations and computer storage and specifically, enhancing operations of a storage device that is connected to a computer host. The function of the memory arrangement is to accept data and store the data until needed again by a user or the host. The arrangement may be configured to accept bursts of data, depending on the computer process performed, therefore the data storage arrangement is configured with multiple memory units that provide for various states of usage. Certain sections of the data storage arrangement are configured of memory systems that provide for fast action (low latency) so that computer processes may be conducted at a rapid pace. Such low latency performance may be accomplished by single layer cell (SLC) memory configurations. If bulk amounts of data are required to be stored, multiple layer cell memory configurations may also be present, such as triple level cell (TLC) memory configurations. The data storage arrangement may have an interface that allows the data storage arrangement to connect with the host. The interface may be a SAS Interface or Serial ATA (SATA) compatible interface, as a non-limiting embodiment. The memory storage may have a configuration to allow for plug and play ability. Although described as having a SATA compatible interface, the memory storage device may be provided with a configuration which allows for access by wireless technology. In one non-limiting embodiment, 802.11ac technology may be used to provide for fast performance for smooth streaming. Wireless technology may use, for example, between 2.5 GHz to 5 GHz frequencies for connection. In some embodiments, the storage may allow users to choose the frequencies for wireless connection. While being described as SATA compatible, other types of interfaces may be used.

Auxiliary connections may be provided to the data storage arrangement to allow for additional options for inputting data directly to the data storage arrangement without interfacing with the host. Such direct input of data may be provided through placement of an integrated secure digital card to offload or copy data. Other auxiliary connections may be provided for additional input/output operations. Such connections may be USB 2.0, USB 3.0, Firewire or other hard wired configurations. Gigabit Ethernet interfaces and connections may also be used.

The data storage arrangement may be configured with a separate power supply or may be run through other power supply means, such as from a computer mother board. In some embodiments, an internal battery may be provided to power the data storage arrangement as an independent entity. Such configurations may be provided such that the data storage arrangement is a portable unit. In such data storage arrangement configurations, the power supply means may be sufficient to power a host and/or charge a host, such as a mobile cellular phone, personal computer, tablet, camera or other configuration. The data storage arrangement may also have a battery indicator to allow a user to understand the amount of charge in the data storage arrangement from a visual inspection. Such battery indicators may be, for example, low energy consumption light emitting diode technology. In specific embodiments, the data storage arrangement may be provided with a circuit to allow for charging and prevent overcharging of the system if the data storage arrangement is connected to an outside power supply for an extended period. In some embodiments, circuitry may be used to determine if a threshold of inactivity has been reached for the storage system, thereby causing the system to enter a low power consumption mode, conserving battery power.

In one non-limiting embodiment, a controller is provided to control actions of the data storage arrangement as required by the host. The controller may also be configured to perform maintenance activities for the data storage arrangement to allow for efficient use.

Internal software may be provided on the data storage arrangement to allow for efficient storage and read capability of data on the system. Such internal software may be used such that the data storage arrangement can be used as a portable media server to wirelessly stream media to a host or output device. Such output devices may include, but not be limited to, smart televisions, smart phones, stereo audio system. The internal software may also be provided such that the access of data may be performed by cloud applications designed for interface with the data storage arrangement.

The internal software of the data storage arrangement may also be configured to provide for security of the data storage arrangement. Safeguarding of material provided on the data storage arrangement prevents unauthorized access to sensitive information contained on the system. Such security may be in the form of password protection, such as a Wi-Fi password protection. In some embodiments, the data storage arrangement may be configured with software that allows the data storage arrangement to create a hardware lock. Such hardware locks may prevent access through a USB connection.

The internal software may also be capable of providing diagnostic support for users. In such configurations, two different modes may be provided. A quick test software program may be provided with the capability to check the data storage arrangement for major performance problems. A full test mode may also be provided to provide detailed status information to a user. Such status information may be, for example, total amount of memory of the data storage arrangement, the amount of memory storage used, storage divisions provided on the data storage arrangement, firmware versions for the internal software, memory block errors and similar data. The internal software may also have the capability of accepting data to update the firmware of the internal software.

The internal software may also be used as a server system wherein in certain embodiments, Digital Living Network Alliance (DLNA) enabled software is incorporated. Such software allows for quick file transfer and error checked operation as a server. In some embodiments, the internal software may be provided with the capability to use file transfer protocol (FTP) to enable the transfer of content to and from the memory storage in public access folders. The data storage arrangement may also provide for either a secured log in or an anonymous login capability.

In specific embodiments, the data storage arrangement may be configured such that the system interacts with cloud storage systems. In the event that the data storage arrangement approaches the limits of storage capability, the data storage arrangement may allow for some of the data to be stored on cloud based systems. Selection of the data to be stored on such external storage systems may be governed by the controller which is configured to determine what sections of data may be appropriately stored in cloud based systems to minimize latency for users. The storage system may have a unique identifier MAC address and device name to allow the system to operate on an independent basis. The storage system may also be operated in a configuration that allows for the system to clone a MAC address of a computer that is attached.

The overall capacity of the data storage arrangement may vary according to the different embodiments provided. Capacities 1 TB, 2 TB up to 64 TB may be provided, as non-limiting embodiments. Different form factors may also be provided. In the illustrated embodiment, a form factor of 2.5 inches is provided. Other form factors such as 1.8 inch or 3.5 inch may also be used. Compatibility of the data storage arrangement may be provided for Windows operating systems, Windows Server, Linux and Mac OS, as non-limiting embodiments. Example Windows operating systems that may use the system may be Windows 10, Windows 8 and Windows 7. Example Mac OS systems may be Lion (Mac OSA 10.7), Mountain Lion (Mac OS 10.8), Yosemite (Mac OS 10.10), El Capitan (Mac OS 10.11), Sierra and Mavericks as non-limiting embodiments. Supported browsers for the storage system may be, in non-limiting embodiments, Internet Explorer, Safari, Firefox and Google Chrome.

Software may also be included in the system to allow for quick and automatic backups of data according to user prescribed requirements. Such backup ability may be compliant with Windows based backup and restore functions and/or Apple Time Machine requirements. Furthermore, software may be provided to add more than one user to the storage system. Users can be added or deleted according to an administration account. Such administration account may also allow for restricted access for certain users according to administration requirements.

Aspects of the disclosure relate to providing methods and apparatus for allowing a computer user to manipulate data. The data may be located, for example, on a solid state drive connected to a computer host. The manipulation of data is performed without a host interface, thus alleviating needs placed upon a host interface. Data can be read, written, sorted or used for computational purposes without the need for a host interface. The aspects of the methods and apparatus are economical to produce and operate, thus providing significant advantages for solid state drive manufacturers that use such technology. The aspects described also provide for the opportunity to update the arrangements and methods provided, thus allowing for alterations in processing over time and allowing the systems to be more reactive to customer needs. As customer needs change over time, the systems provided are not outdated, but rather can be updated, as necessary.

Aspects of the disclosure may use a write buffer command for supplying a virtual machine to manipulation of customer data (i.e. writing or reading of customer data). For definitional purposes, a write buffer is a buffer that is provided in a central processing unit ("CPU") cache architecture. A virtual machine, as defined, is a computer code that may provide for an emulation of a computer system or may be specifically written to perform a desired task. The virtual machine, therefore, may be constructed of code to write and read data from specified sections of data. In non-limiting embodiments, a first virtual machine may be configured to provide for writing and reading of customer provided data. In other non-limiting embodiments, a second virtual machine may be configured to provide for writing and reading of data other than customer data. The virtual machine is based upon, in one embodiment, an architecture of the solid state drive that the virtual machine is placed upon. As such, the virtual machine may use, specific hardware, software or a combination of both. In embodiments, provided herein, processing of the computer code may occur through a processor that is placed within the solid state drive, thus not using hardware associated with the computer host. Such processor may be located within, for example, a controller of the solid state drive. In another embodiment, an application specific integrated circuit ("ASIC") may be provided to provide for the processing capabilities needed. In other embodiments, the virtual machine may be provided with different capabilities and different versions of the virtual machine may be used. The virtual machine may be provided with different coding, thus allowing for more than one (multiple) operating systems to be utilized. One operating system may allow for writing of data, while a second operating system may allow for reading of data. In different embodiments the different operating systems may be used and switched, as needed. The virtual machine may also be a combination of a processor used within the solid state drive and an application specific integrated circuit.

Referring to FIG. 1, an apparatus 100 to manipulate customer without using a host interface is illustrated. In the illustrated embodiment, the apparatus 100 comprises a device 104 that is provided with an input/output 106 for data. The device 104 may be configured to be connected to a computer host 102. In the illustrated embodiment, the device 104 may be a solid state drive having a memory arrangement 112. The solid state drive may be configured of NAND flash memory units to allow for storage of data within the drive. The NAND flash memory units may be SLC components, TLC components or other similar components. The SLC or TLC components store charge with the component and therefore can be read by devices that are configured to perform such functions. The SLC or TLC components, therefore, physically change composition based upon the storage or non-storage of data.

The input/output arrangement 106 allows for data to be accepted by the device 104. Such data may be digital information relating to user data. At least one transmission pathway 108 is configured to receive data from the input/output arrangement 106. The at least one transmission pathway 108 is connected to at least one physical processor 110, the physical processor 110 is connected to the memory arrangement 112. The physical processor 110 is provided to provide computing capacity within the device 104, and the physical processor 110 comprises a buffer memory 120. A virtual machine 114 is also connected to the at least one transmission pathway 108. The virtual machine 104 may comprise a processor 122. The virtual machine 114 is configured to alter data stored in the memory arrangement 112. The altering of data within the device 104 may be writing data to the device 104, erasing data on the device 104 or other alterations. The virtual machine 114 may be a code created virtual machine 114 that uses the physical processor 110 to retrieve data from the SLC or TLC components, for example, and perform functions based upon the needs of a user. The virtual machine 114 may interface with other sections of the apparatus 100 through a small computer system interface ("SCSI"). The virtual machine 114 may query a state via an inquiry, test unit ready, read capacity or request sense commands. In this manner, the virtual machine 114 may appear to the remainder of the drive as an SCSI initiator. The advantage of using the virtual machine 114 is that the virtual machine 114 allows for using on-board processing capability of the memory arrangement 112 to perform necessary functions. Such functions are carried out in a "background" environment wherein a host adapter is not used during the computational activities. As the functions do not use a host adapter, the host adapter is available for use to other functions. Requests, therefore, do not stack up at the host adapter to be processed, but rather flow more freely, increasing the speed of computer operations. A special buffer write command may be used to initiate a sequence of steps to start the processing. Other commands may be used to initiate processing steps as well. Such command may be, for example, time oriented, wherein after a given amount of time has passed, processing starts for different types of operations. A scheduler 116 may be provided with the device 104, therefore performing operations according to a defined schedule. The scheduler 116 may also be updated, for example, over a period of time to allow necessary tasks to be performed more frequently or less frequently, according to user needs.

Although disclosed as a NAND based memory arrangement, other configurations are possible. In another non-limiting embodiment, a hard disk drive may be used as the memory arrangement 112. In either of the above embodiments, a drive controller 118 may be provided to direct drive actions. The virtual machine 114 may interact with the drive controller 118 through the transmission pathway 108. The drive controller 118, therefore may prioritize drive functions according to a hierarchy, as needed. The hierarchy may be pre-defined to the drive controller 118. As will be understood, the firmware for the drive controller 118 may be updated from time to time to change the hierarchy.

The device 104 may also be configured with an internal battery and systems similar, such as capacitors, to provide electrical energy to the processor 110, the NAND flash and other components. The methods and apparatus to manipulate customer data without using a host interface, therefore, may be a self contained unit and not dependent upon a host computer to function.

In the illustrated embodiment, a NAND flash controller may be provided to directly control actions related to the NAND flash memory when so equipped. The NAND flash controller is connected to the processor 110 through the transmission pathway 108 for provision of data and to and from the NAND flash controller.

The virtual machine 114 may have several functions. Aside from obtaining data from the memory arrangement to perform processing functions in conjunctions with the processor 110, the virtual machine 114 may also perform other functions. In one such function, the virtual machine 114 may provide an application programming interface to query drive characteristics. The query may include the manufacturer of the drive, the drive capacity, the remaining unused drive capacity, model number, operational statistics, age, types of data stored on the drive as non-limiting embodiments. The virtual machine 114 may also provide an application programming interface to establish a unit attention for all initiators. The virtual machine 114 may provide other functions, such as providing a fixed number of logical based address slots available for processing functions.

Figure 2:
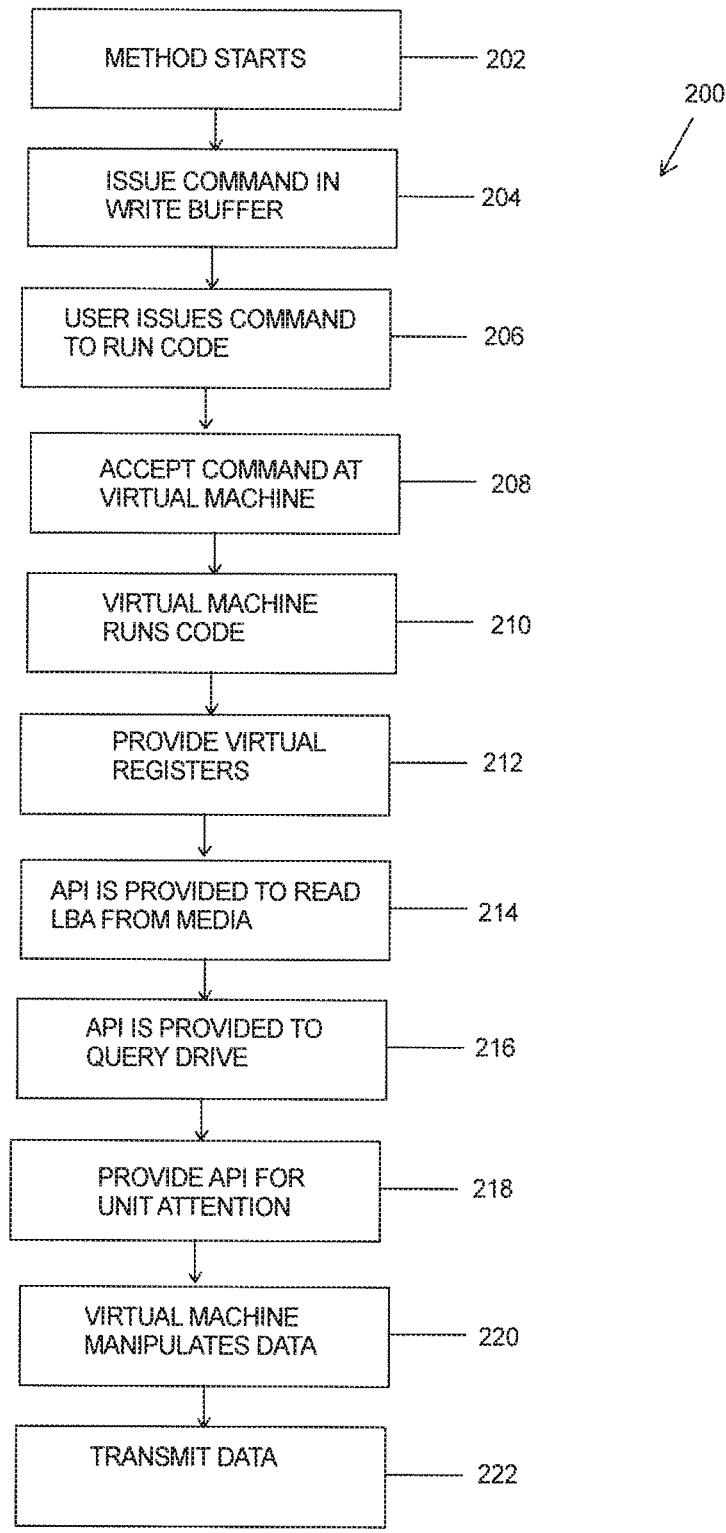
FIG. 2 is flow chart for a method in conformance with a described aspect of the disclosure.

Referring to FIG. 2, in one embodiment a method 200 is described for manipulating customer data without a host interface. The method starts at 202. At 204, a user or customer issues a write buffer command that provides a connected solid state drive with code. At 206, a user or customer provides a command to start running the code. At 208, a virtual machine within the solid state drive accepts the command to run the code. At 210, the virtual machine runs the customer code. At 212, a number of virtual registers are provided, as well as an amount of memory and a number of logical based address slots. The number of logical based address slots may be fixed. The number of virtual registers may also be fixed. At 214, an application programming interface is provided that can be used to read logical based address from a media to a slot and write from a slot to the media. At 216, an application programming interface is provided to query drive characteristics. Application drive characteristics may be the maximum number of logical based addresses, maximum drive size and format characteristics. At 218, an application program interface to establish a unit attention on all initiators. At 220, the virtual machine may alter or manipulate data stored in the drive and stored the data in the drive. At 222, the altered or manipulated data may be transmitted to a host at a time wherein the transmission of data will not cause latency issues with the overall computer processing functions. In embodiments that require more robust processing, the virtual machine 114 may authorize additional memory from the memory arrangement to be used during computational and functional operations.

In one non-limiting embodiment, a method for changing data within a solid state drive without using a host interface is disclosed comprising issuing a write buffer command with a code to the solid state drive, receiving the code at the solid state drive, storing the code at the solid state drive, transmitting a command to run the code at the solid state drive, running the code with a processor in a virtual machine arranged within the solid state drive, wherein the running of the code alters data within the solid state drive and altering at least one memory arrangement in the solid state drive such that the memory arrangement records the altered data.

In another non-limiting embodiment, the method is performed wherein the running of the code with the processor is performed in a background environment of the solid state drive.

In another non-limiting embodiment, the method may further comprise activating a solid state drive to retrieve the altered data within the solid state drive and transmitting the altered data to a host.

In another non-limiting embodiment, the method may be performed wherein the processor also controls solid state drive functions other than running the virtual machine code.

In another non-limiting embodiment, the method may be performed wherein the storing the code at the solid state drive is in a buffer memory of the processor.

In another non-limiting embodiment, the method may be performed wherein the running of the code to alter the data within the solid state drive is through a write command.

In another non-limiting embodiment, the method may be performed wherein the executing the code with the processor in the virtual machine comprises providing a fixed number of virtual registers.

In another non-limiting embodiment, the method may be performed wherein the executing the code with the processor in the virtual machine comprises providing a fixed number of LBA slots.

In another non-limiting embodiment, the method may be performed wherein the executing the code with the processor in the virtual machine comprises providing an application programing interface to query drive characteristics.

In another non-limiting embodiment, the method may be accomplished wherein the query drive characteristics are one of a maximum number of logical based addresses, a drive format type, and a drive capacity.

In another non-limiting embodiment, the method may be accomplished wherein the executing the code with the processor in the virtual machine further comprises providing an application programming interface to read logical based addresses from a media to a slot.

In another non-limiting embodiment, the method may be accomplished wherein the application programming interface is configured to further write data from the slot to the media.

In another non-limiting embodiment, the method may be accomplished wherein the executing the code with the processor in the virtual machine comprises providing an application programming interface to establish a unit attention on all initiators.

In another non-limiting embodiment, the method may be accomplished wherein the executing the code with the processor in the virtual machine comprises providing an amount of memory within the solid state drive to a stack for processing.

In one non-limiting embodiment, an apparatus for manipulating data in a memory arrangement, comprising: means for issuing a write buffer command with a code to memory arrangement and transmitting a command to run a code at the memory arrangement, means for receiving the code at a means within the memory arrangement configured to receive code, means for storing the code at the solid state drive; means for executing the code with a processor in a virtual machine arranged within the memory arrangement wherein the running of the code alters data within the memory arrangement and means for altering at least one memory unit in the memory arrangement such that the memory arrangement records the altered data.

In another non-limiting embodiment, the apparatus for manipulating data in the memory arrangement is configured wherein the means for executing the code with the processor is performed in a background environment of the memory arrangement.

In another non-limiting embodiment, the apparatus for manipulating data in the memory arrangement further comprises means for activating the memory arrangement to retrieve the altered data within the memory arrangement and means for transmitting the altered data to a host.

In another non-limiting embodiment, the apparatus for manipulating data in a memory arrangement may be configured wherein the means for storing the code at the memory arrangement is in a buffer memory of the processor.

In another non-limiting embodiment, the apparatus for manipulating data in a memory arrangement is configured wherein the means for running of the code to alter the data within the memory arrangement is conducted by a write command.

In another non-limiting embodiment, the apparatus for manipulating data in a memory arrangement is configured wherein the means for executing the code with the processor in the virtual machine further comprises means for providing a fixed number of virtual registers.

In another non-limiting embodiment, the apparatus for manipulating data in a memory arrangement is configured wherein the means for executing the code with the processor in the virtual machine comprises provides a means for providing a fixed number of logical based address slots.

In another non-limiting embodiment, the apparatus for manipulating data in a memory arrangement is configured wherein the means for executing the code with the processor in the virtual machine comprises means for providing an application programming interface to query drive characteristics.

In another non-limiting embodiment, an apparatus to store and perform alteration of data is disclosed comprising a device with an input and an output for data, the device configured to be connected to a computer, the device comprising, a memory arrangement within the device, configured to send and receive data from a host at least one physical processor connected to the memory arrangement, the at least one physical processor configured to receive and process data from the memory arrangement, at least one transmission pathway connecting the memory arrangement and the at least one physical processor, the at least one transmission pathway configured to transmit data and a virtual machine connected to the at least one transmission pathway, the virtual machine configured to at least one of alter data stored on the memory arrangement without a use of a host adapter.

In another non-limiting embodiment, the apparatus wherein the device is one of a hard disk drive and a solid state drive.

In another non-limiting embodiment, the apparatus may further comprise a drive controller, wherein the at least one physical processor is connected to the drive controller and the drive controller is configured to send, generate and receive operations for performing memory alteration activities.

While the foregoing is directed to embodiments of the present disclosure, other and further embodiments of the disclosure may be devised without departing from the basic scope thereof, and the scope thereof is determined by the claims that follow.

What is claimed is:

1. A method for changing data within a solid state drive without using a host interface, comprising:
    issuing a write buffer command with a code to the solid state drive;
    receiving the code at the solid state drive;
    storing the code at the solid state drive;
    transmitting a command to run the code at the solid state drive;
    executing the code with a processor in a virtual machine arranged within the solid state drive, wherein the running of the code alters data within the solid state drive, and wherein the executing the code with the processor is performed in a background environment of the solid state drive; and
    altering at least one memory arrangement in the solid state drive such that the memory arrangement records the altered data.

2. The method according to claim 1, further comprising:
    activating the solid state drive to retrieve the altered data within the solid state drive; and
    transmitting the altered data to a host.

3. The method according to claim 1, wherein the processor also controls solid state drive functions other than running the code.

4. The method according to claim 1, wherein the storing the code at the solid state drive is in a buffer memory of the processor.

5. The method according to claim 1, wherein the executing of the code to alter the data within the solid state drive is through a write command.

6. The method according to claim 1, wherein the executing the code with the processor in the virtual machine comprises:
    providing a fixed number of virtual registers.

7. The method according to claim 1, wherein the executing the code with the processor in the virtual machine comprises:
    providing a fixed number of logical based address slots.

8. The method according to claim 1, wherein the executing the code with the processor in the virtual machine comprises:
    providing an application programing interface to query drive characteristics.

9. The method according to claim 8, wherein the query drive characteristics are one of a maximum number of logical based addresses, a drive format type, and a drive capacity.

10. The method according to claim 1, the executing code with the processor in the virtual machine further comprises:
    executing a program to create an application programming interface to read logical based addresses from a media to a slot.

11. The method according to claim 10, wherein the application programming interface is configured to further write data from the slot to the media.

12. The method according to claim 1, wherein the executing the code with the processor in the virtual machine comprises:
    executing a program to create an application programming interface to establish a unit attention on all initiators.

13. The method according to claim 1, wherein the executing the code with the processor in the virtual machine comprises:
    allotting an amount of memory within the solid state drive to a stack for processing.

14. A method for changing data within a solid state drive without using a host interface, comprising:
    issuing a write buffer command with a code to the solid state drive;
    receiving the code at the solid state drive;
    storing the code at the solid state drive;
    transmitting a command to run the code at the solid state drive; executing the code with a processor in a virtual machine arranged within the solid state drive, wherein the running of the code alters data within the solid state drive, and wherein the executing the code with the processor in the virtual machine comprises providing a fixed number of virtual registers; and
    altering at least one memory arrangement in the solid state drive such that the memory arrangement records the altered data.

15. The method according to claim 14, further comprising:
    activating the solid state drive to retrieve the altered data within the solid state drive; and
    transmitting the altered data to a host.

16. The method according to claim 14, wherein the processor also controls solid state drive functions other than running the code.

17. The method according to claim 14, wherein the storing the code at the solid state drive is in a buffer memory of the processor.

18. A method for changing data within a solid state drive without using a host interface, comprising:
    issuing a write buffer command with a code to the solid state drive;
    receiving the code at the solid state drive;
    storing the code at the solid state drive;
    transmitting a command to run the code at the solid state drive;
    executing the code with a processor in a virtual machine arranged within the solid state drive, wherein the running of the code alters data within the solid state drive, and wherein the executing the code with the processor in the virtual machine comprises allotting an amount of memory within the solid state drive to a stack for processing; and
    altering at least one memory arrangement in the solid state drive such that the memory arrangement records the altered data.

19. The method according to claim 18, wherein the executing of the code to alter the data within the solid state drive is through a write command.

20. The method according to claim 18, wherein the executing the code with the processor in the virtual machine comprises:

providing a fixed number of logical based address slots.

21. The method according to claim 18, wherein the executing the code with the processor in the virtual machine comprises:

providing an application programing interface to query drive characteristics.

22. A method for changing data within a solid state drive without using a host interface, comprising:

issuing a write buffer command with a code to the solid state drive;

receiving the code at the solid state drive;

storing the code at the solid state drive;

transmitting a command to run the code at the solid state drive;

executing the code with a processor in a virtual machine arranged within the solid state drive, wherein the running of the code alters data within the solid state drive, and wherein the executing the code with the processor in the virtual machine comprises executing a program to create an application programming interface to establish a unit attention on all initiators; and altering at least one memory arrangement in the solid state drive such that the memory arrangement records the altered data.

23. The method according to claim 22, wherein the executing the code with the processor in the virtual machine comprises:

providing an application programing interface to query drive characteristics, wherein the query drive characteristics are one of a maximum number of logical based addresses, a drive format type, and a drive capacity.

24. The method according to claim 22, the executing the code with the processor in the virtual machine further comprises:

executing a program to create an application programming interface to read logical based addresses from a media to a slot.

25. The method according to claim 24, wherein the application programming interface is configured to further write data from the slot to the media.

* * * * *